(12) United States Patent
Mallinson

(10) Patent No.: US 10,680,638 B2
(45) Date of Patent: Jun. 9, 2020

(54) LINEARITY IN A QUANTIZED FEEDBACK LOOP

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 0 days.

(21) Appl. No.: 16/503,553

(22) Filed: Jul. 4, 2019

(65) Prior Publication Data

US 2020/0014398 A1 Jan. 9, 2020

Related U.S. Application Data

(60) Provisional application No. 62/693,984, filed on Jul. 4, 2018.

(51) Int. Cl.
*H03M 3/00* (2006.01)
*H03L 7/197* (2006.01)

(52) U.S. Cl.
CPC .......... *H03M 3/366* (2013.01); *H03L 7/1978* (2013.01); *H03M 3/458* (2013.01)

(58) Field of Classification Search
CPC ........ H03M 3/366; H03M 3/458; H03M 3/43; H03L 7/1978
USPC .................................................. 341/143, 120
See application file for complete search history.

(56) References Cited

U.S. PATENT DOCUMENTS

| 7,058,464 | B2 | 6/2006 | Mallinson | |
|---|---|---|---|---|
| 9,762,258 | B2 | 9/2017 | O'brien et al. | |
| 10,560,111 | B2* | 2/2020 | Mo | H03M 3/438 |
| 10,566,991 | B2* | 2/2020 | Cao | H03M 3/368 |
| 10,615,820 | B2* | 4/2020 | Lien | H03M 3/494 |

OTHER PUBLICATIONS

Bob Adams, "Sigma-Delta New Algorithms and Techniques", Analog Devices, Inc., www.analog.com, Apr. 30, 2018) (https://web.archive.org/web/20180430172037/http://www2.cscamm.umd.edu/programs/ocq05/adams/adams_ocq05.pdf).

* cited by examiner

*Primary Examiner* — Brian K Young
(74) *Attorney, Agent, or Firm* — Gard & Kaslow LLP

(57) ABSTRACT

Described herein is a method and apparatus for reducing ISI in a single-bit ΣΔ modulator without reducing the dynamic range of the modulator. In one embodiment, the signal fed back to the input of the modulator is not the single-bit outputs of a quantizer as in the prior art, but rather patterns of such outputs. The patterns are selected so that each pattern has the same number of transition edges and there is thus no mismatch of transition times. In one embodiment, the patterns are created by digital logic. In another embodiment, an analog signal is added to the error signal in the feedback loop which causes the quantizer to generate the patterns. When the amplitude of the input signal exceeds a certain level, the modulator reverts to the typical operation of a prior art modulator, thus preserving the full dynamic range of the modulator.

10 Claims, 7 Drawing Sheets

LINEARITY IN A QUANTIZED FEEDBACK LOOP

This application claims priority from Provisional Application No. 62/693,984, filed Jul. 4, 2018, which is incorporated by reference herein in its entirety.

FIELD OF THE INVENTION

The present invention relates generally to sigma-delta modulators, and more particularly to sigma-delta modulators with improved linearity.

BACKGROUND OF THE INVENTION

Quantized feedback may be used in control loops to perform analog to digital conversion. Analog to digital converters (ADCs) with such features are often known as sigma-delta ($\Sigma\Delta$) converters, or $\Sigma\Delta$ modulators, the modulator term referring to an output digital data stream having a certain symbol pattern, or modulation, imposed upon it by the control loop. The terms $\Sigma\Delta$ modulator and noise shaping control loop are often used interchangeably in the art, although the latter is more descriptive. Circuit designers often like to use such $\Sigma\Delta$ modulators as in many cases they may be simpler to design and cheaper to make than other types of ADCs.

In such a noise shaping control loop, a continuous analog signal is applied at the input, and a digital pattern representative of this signal emerges from the output. The digital signal is created by one or more quantization elements in the control loop, for example, by non-linear elements in the loop such as flip-flops or comparators that have a discrete set of non-continuous output values for any given continuous input quantity.

The $\Sigma\Delta$ modulation works by constraining a feedback parameter to one of a set of at least two specific values, and a control loop of arbitrary order ensures that the average feedback value equals the input. Instantaneous deviations from the ideal continuous feedback necessarily introduced by quantization elements represent noise, and a sophisticated, possibly high order, control loop can suppress or "shape" this noise. To "shape" the noise means to filter it, generally to make it not appear in certain frequency bands. The loop therefore operates to suppress this noise in certain frequency bands of interest, often at the expense of increased noise in bands that are not relevant to the application. Hence $\Sigma\Delta$ modulators are sometimes also referred to a "noise shaping loops."

Single-bit noise shaping loops are uncommon, due to a known problem in a quantized feedback loop of the type that integrates the feedback signal, i.e., a control loop of a continuous time design (rather than a switched capacitor design) in which the average value of the feedback signal is the time integral of that signal; this problem is known as intersymbol interference ("ISI"). ISI is a form of distortion of a signal in which one symbol interferes with subsequent symbols. This is an unwanted phenomenon as the interference from the previous symbols has a similar effect to noise, and make the communication less reliable. The spreading of the pulse beyond its allotted time interval causes it to interfere with neighboring pulses.

The details of the transition between feedback levels are important in integrating feedback loops. FIG. 1 is an illustration of how mismatched transition times can cause ISI. FIG. 1 illustrates how the transition between two feedback levels, a "high" level and a "low" level, here shown as 1 and 0, can be matched or mismatched. The upper curve in FIG. 1 shows matched rise and fall times, i.e., the transition time from 0 to 1 and the transition time from 1 to 0 take the same amount of time, while the lower curve shows transition times that are mismatched, i.e., they differ. This mismatch of rise and fall times introduces a signal dependent error due to a variation of the number of rise and fall edges with the signal amplitude which will cause ISI, and therefore an error will be present in the output.

It is thus apparent that ISI may be suppressed based on the observation that if the number of edges present in the feedback signal were constant, then the ISI from mismatched rise and fall times would represent only a DC shift in the transfer characteristic and no noise or distortion would arise. One of skill in the art will be able to find prior art attempts to suppress ISI by forcing a constant frequency of signal edges in the feedback signal.

However, this known solution has a significant drawback. When a constant frequency of signal edges is present in the feedback, the dynamic range is limited because the modulator cannot produce a constant full-scale feedback pattern. Were the modulator to produce such a pattern, i.e., one in which the quantizer produces all high level or low level outputs, there would be no changes, i.e., no signal edges, in the feedback. Consequently, schemes to force a fixed frequency of feedback edges result in a reduction of dynamic range.

Other known solutions seek to limit the effect of ISI by increasing the number of bits in the noise shaping loop. However, such solutions involve additional components, and thus expense, in constructing the $\Sigma\Delta$ modulator.

It is thus desirable to find a method to reduce ISI in a single-bit $\Sigma\Delta$ modulator without reducing the dynamic range of the $\Sigma\Delta$ modulator.

SUMMARY OF THE INVENTION

Described herein is a method and apparatus for reducing ISI in a single-bit $\Sigma\Delta$ modulator without reducing the dynamic range of the $\Sigma\Delta$ modulator.

One embodiment describes an apparatus, comprising: a first adder configured to receive an input signal and a feedback signal and to output a sum of the input signal and the feedback signal as an error signal; a filter coupled to the first adder and configured to receive as an input the error signal, generate a filtered error signal, and output the filtered error signal; a quantizer coupled to the filter and configured to receive as an input the filtered error signal and to generate a plurality of quantizer outputs upon receipt of a series of clock signals, each one of the plurality of quantizer outputs being high or low depending upon the filtered error signal; a control circuit configured to generate a plurality of control signals, each one of the plurality of control signals selecting a different one of a plurality of multi-bit feedback signals comprising a plurality of quantizer outputs; and a switch coupled to the control circuit, the quantizer, and the first adder, the switch having a first position in which a first one of the plurality of control signals selects a first one of the multi-bit feedback symbols to be fed back to the first adder and a second position in which a second one of the plurality of control signals selects a second one of the multi-bit feedback symbols to be fed back to the first adder; whereby the first adder receives as the feedback signal either the first one of the plurality of multi-bit feedback symbols or the second one of the plurality of multi-bit feedback symbols to be added to the input signal.

Another embodiment describes an apparatus, comprising: a first adder configured to receive an input signal and a feedback signal and to output a sum of the input signal and the feedback signal as an error signal; a filter coupled to the first adder and configured to receive as an input the error signal, generate a filtered error signal, and output the filtered error signal; a second adder coupled to the filter and configured to receive as inputs the filtered error signal and an analog signal and to output a sum of the filtered signal and the analog signal as a modified error signal, the analog signal comprising a repeating series of voltage levels; and a quantizer coupled to the filter and configured to receive as an input the modified error signal and to generate as the feedback signal a plurality of quantizer outputs upon receipt of a series of clock signals, each quantizer output being generated upon receipt of a clock signal and being high or low depending upon the modified error signal.

DETAILED DESCRIPTION OF THE INVENTION

Described herein is a method and apparatus for reducing ISI in a $\Sigma\Delta$ modulator without reducing the dynamic range of the $\Sigma\Delta$ modulator.

In one embodiment, the signal fed back to the input of a single-bit $\Sigma\Delta$ modulator is not just the single bit outputs of a quantizer in the feedback loop as in the prior art, but rather patterns of such outputs. The patterns are selected so that each pattern has the same number of transition or signal edges and thus there is no mismatch of transition times. In one embodiment, the patterns are created by digital logic.

In another embodiment, an analog signal is added to the error signal in the feedback loop which causes the quantizer to generate the patterns. When the amplitude of the input signal exceeds a certain level, the error signal overwhelms the added analog signal, so that use of the patterns is disabled and the $\Sigma\Delta$ modulator reverts to the typical operation of a prior art $\Sigma\Delta$ modulator, thus preserving the full dynamic range of the $\Sigma\Delta$ modulator.

Providing a constant frequency of signal edges when the input signal is small provides ISI suppression when ISI as a fraction of the signal is more relevant; the circuit then reverts to a conventional mode of operation when the input signal is large and the ISI is not as significant due to the presence of other distortion. Thus, the use of the pattern signals does not prevent the $\Sigma\Delta$ modulator from reaching its full nominal range. (As will be shown, however, in some cases larger signals may also benefit from this technique.)

Figure 1:
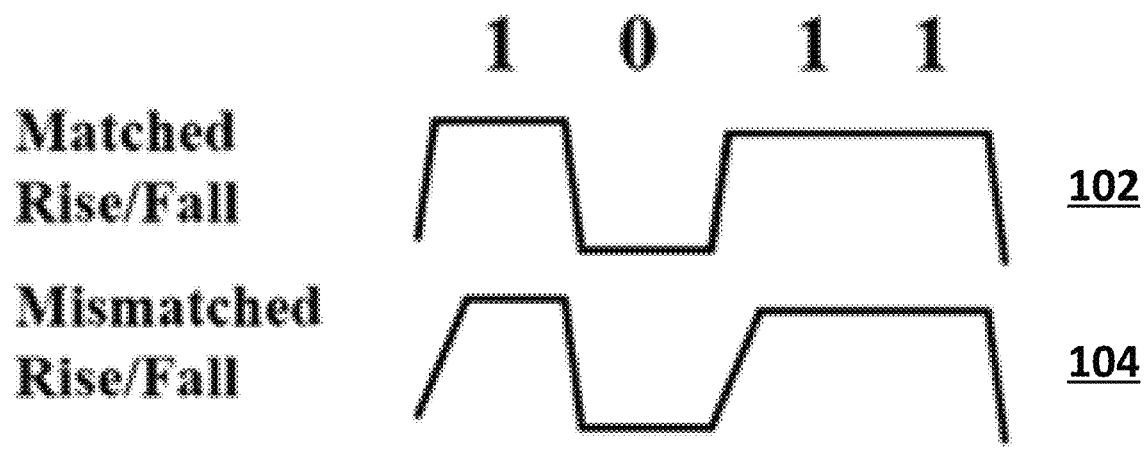
FIG. 1 is a diagram of high and low level outputs from a quantizer as is known in the prior art.
Figure 2:
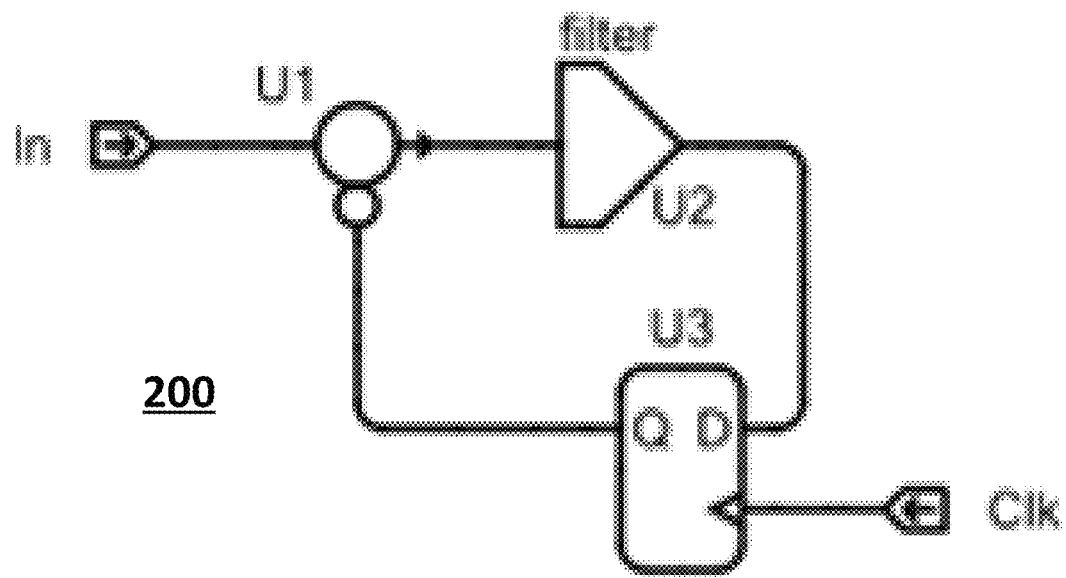
FIG. 2 is a circuit diagram of a single-bit sigma-delta modulator as is known in the prior art.

FIG. 2 is a circuit diagram of a single-bit $\Sigma\Delta$ modulator 200 in a typical prior art embodiment. The signal from filter U2 causes quantizer U3 to output a signal upon each clock cycle that is then compared (i.e., inverted and added) to the input signal at adder U1; the feedback loop causes quantizer U3 to generate outputs that seek to keep the input to filter U2 at a value of 0.

The discussion below assumes that the high and low level outputs generated by quantizer U3 are 1 or −1, respectively. As is known in the art, which level quantizer U3 outputs depends upon its input received from filter U2; quantizer U3 will output values that seek to match the input signal, such that when the quantizer output is inverted and added to the input signal by adder U1 the resulting difference, or error signal, is minimized as close to zero as possible. Thus, if the value of the input signal is 0, then quantizer U3 will output (after a transition time) a series of values:

$$-1\ 1\ -1\ 1\ -1\ 1\ -1\ 1$$

i.e., the average value of this series of values is 0, the same as the input signal.

Of course, the input signal is not always 0. For example, if the input signal has a value of 0.5, the quantizer U3 will output:

$$-1\ 1\ 1\ 1\ -1\ 1\ 1\ 1$$

so that the average value of the series is 0.5, again the same as the input signal. (Note that while one can construct different sequences that arrive at the same average values as those shown herein, the illustrated sequences each minimize the root mean square (RMS) value of noise for their respective values, and thus are the sequences that will be used to minimize noise in the circuit.)

It can thus be seen that the number of transition edges varies with the amplitude of the input signal; in the case of a 0 input signal there is an edge on every transition from 1 to −1 or from −1 to 1, while in the case of a 0.5 input signal there are only two transitions in four cycles. Thus, circuit 200 will suffer from ISI if the transition times from 1 to −1 and from −1 to 1 differ.

However, the difference in transition times will be equal at different amplitudes if the number of transition edges in different sequences can be made to be the same; in such a case there will be no mismatch and thus no ISI. One way to keep the number of transition edges equal is to choose a feedback symbol that is a multi-bit pattern, rather than using merely a 1 or a −1 as each feedback symbol. Note that in this context multi-bit does not have the conventional meaning of one of a set of values distributed over amplitude, but rather one of a set of values distributed over time.

In one embodiment such a pattern comprises three bits in succession for each decision point. Using the quantizer outputs of 1 and −1, two three-bit patterns that may be used are:

−1 −1 1 and

−1 1 1

Each of these patterns has a single transition within it. The first pattern of (−1, −1, 1) has an average value of −⅓, and is referred to herein as the "one-third pattern," or OT sequence, since one-third of its values are high. The second pattern of (−1, 1, 1) has an average value of ⅓ and is referred to herein as the "two-thirds pattern, or TT sequence, since two-thirds of its values are high.

Using such three bit patterns, if the input signal is 0, the feedback will be:
(−1, −1, 1) (−1, 1, 1) (−1, −1, 1) (−1, 1, 1) (−1, −1, 1) (−1, 1, 1) (−1, −1, 1) (−1, 1, 1) or, without the parentheses or commas:

-1 -1 1 -1 1 1 -1 -1 1 -1 1 1 -1 -1 1 -1 1 1 -1 -1 1 -1 1 1

In this sequence there are 24 bits (rather than 8 when each feedback symbol is merely a 1 or −1 as above), 12 of which are 1 and 12 are −1, so that the average feedback is 0, as is the input signal. Further, each decision point has two transition edges, so there is no mismatch of transition times and thus no ISI.

If the input signal is 0.5, the feedback signal will be:
(−1, −1, 1) (−1, 1, 1) (−1, 1, 1) (−1, 1, 1) (−1, −1, 1) (−1, 1, 1) (−1, 1, 1) (−1, 1, 1)
Again there are 24 bits, but now 14 are 1 while 10 are −1, for a total difference of 4, which over 8 symbols is an average of 0.5, the same as the input signal. Again there are two transition edges for each decision point, so again there is no ISI.

One of skill in the art in light of the teachings herein will understand what sequence of symbols in the feedback signal will balance a given input value, and also how to use a different number of bits for each feedback symbol if desired.

One of skill in the art in light of the teachings herein will also appreciate the limitation of the use of multi-bit feedback symbols, i.e., choosing the same symbol each time can only ever balance signals between ⅓ and ⅔ of the equivalent input. Thus, while the multi-bit symbols can remove ISI by forcing a constant frequency of signal edges, the range of equivalent input signal is restricted to only ⅓ of the input range.

In some cases, this may be sufficient to improve performance of a ΣΔ modulator if the system can work adequately in the restricted range. In practical implementations, suppression of ISI in this limited ⅓ portion of the input range may be so significant that a net benefit occurs, and the new full scale may be considered to be the ⅓ to ⅔ of the original input range.

Figure 3:
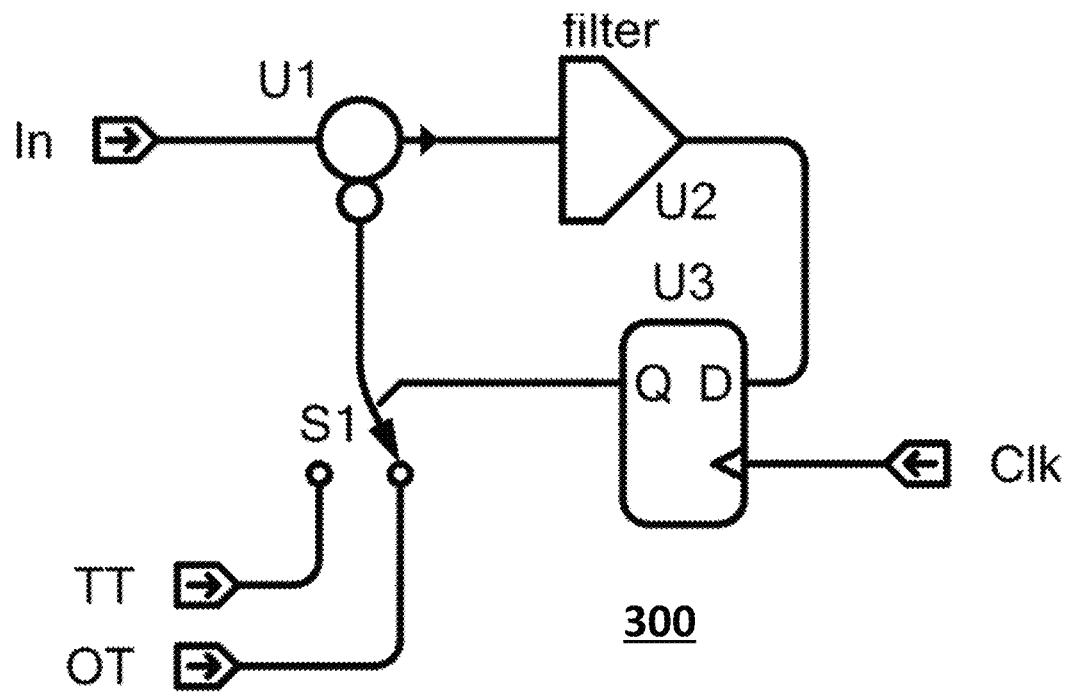
FIG. 3 is a circuit diagram of an improved single-bit sigma-delta modulator according to one embodiment.

FIG. 3 shows a circuit 300 in one embodiment of the present approach in which a switch S1 is used to select between the (−1, −1, 1) and (−1, 1, 1) patterns. The output of the quantizer U3 supplies the individual bits, and the signal OT uses those individual bits to execute the OT sequence (−1, −1, 1), while the signal TT executes the TT sequence (−1, 1, 1).

Figure 4:
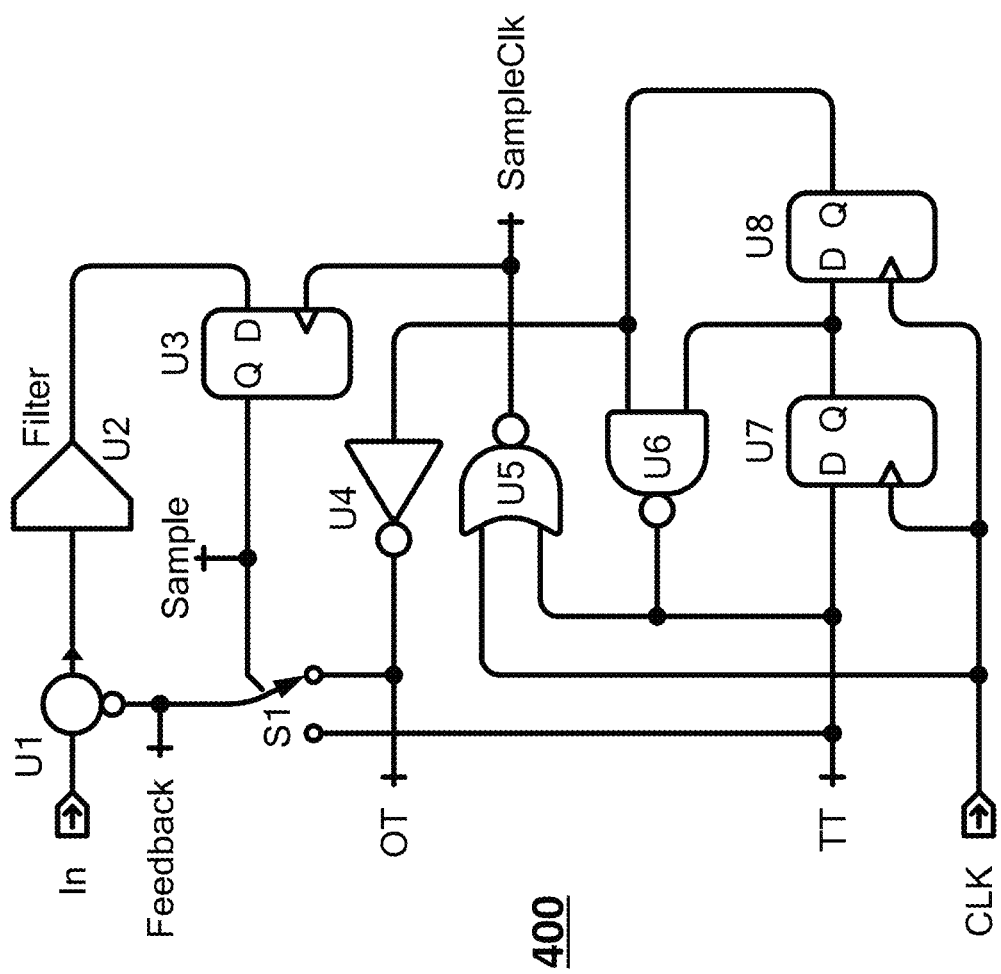
FIG. 4 is a circuit diagram of an improved single-bit sigma-delta modulator according to another embodiment.

FIG. 4 shows a more complete version of the embodiment of FIG. 3; circuit 400 adds to circuit 300 of FIG. 3 one embodiment of a control circuit that provides the signals OT and TT. One of skill in the art will appreciate that there are many alternative ways to provide such a control circuit.

Figure 5:
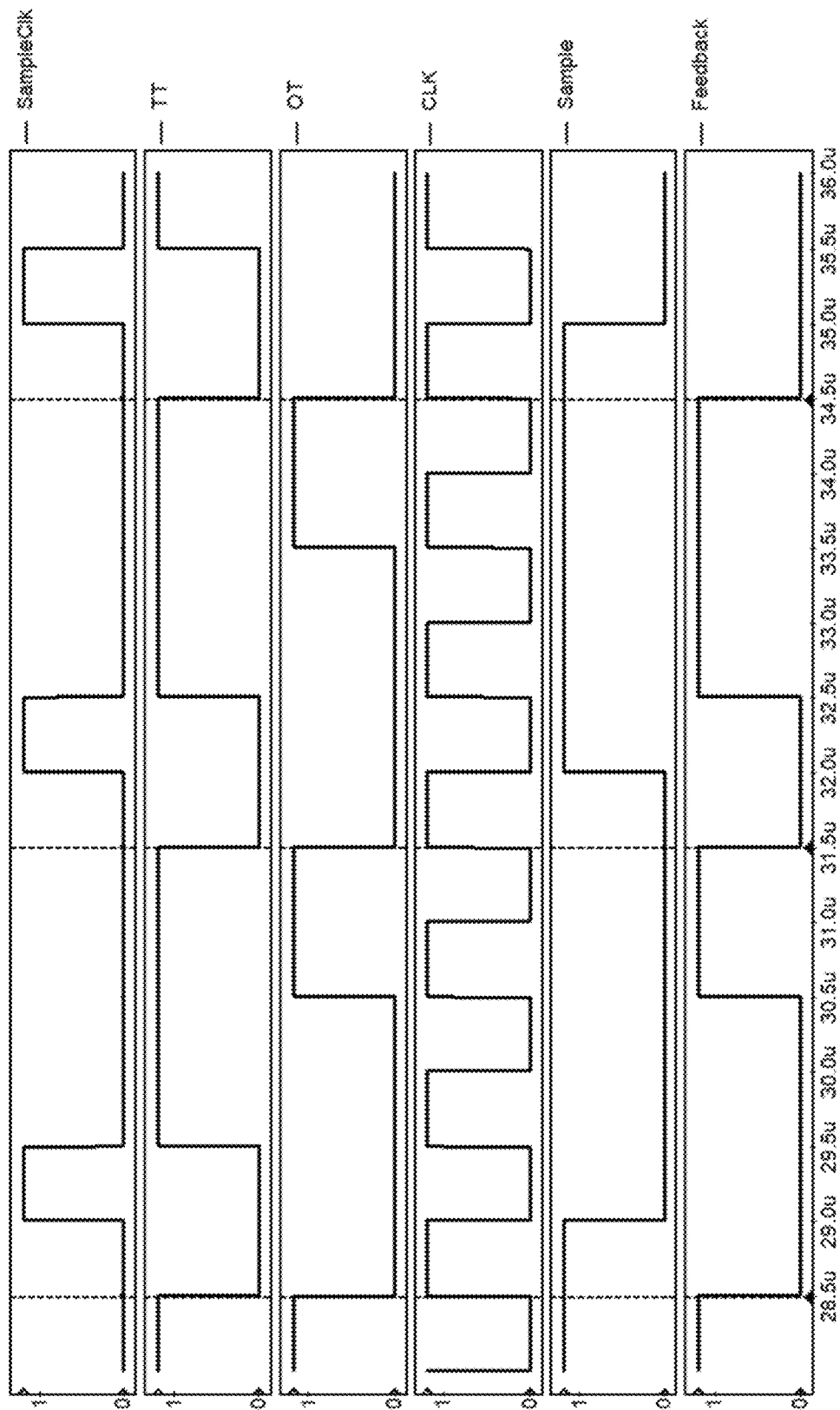
FIG. 5 is a graph showing the timing of various signals in the circuit of FIG. 4.

FIG. 5 shows the signals in circuit 400 of FIG. 4. A clock signal SampleClk is used both to time the input signal samples and to cause quantizer U3 to determine its output based upon the input signal. The input signal is shown here as signal Sample, with a transition from 1 to 0 upon a SampleClk signal at 29 microseconds and a transition from 0 to 1 upon another SampleClk signal at 32 microseconds.

Signals OT and TT, generated by the control circuitry in circuit 400 of FIG. 400 as above, use the output of quantizer U3 to create the feedback signals (−1, −1, 1) and (−1, 1, 1). Another clock signal CLK drives the control circuit, at three times the speed of SampleClk and the input samples and quantizer U3. The signal Feedback shows the resulting feedback signal, which includes the feedback symbol (−1, −1, 1) followed by the feedback symbol (−1, 1, 1), and which is fed back to adder U1.

The circuit of FIG. 4, or that of FIG. 3, may be thought of as a "digital" solution, given both the absence of changes to the analog components of the loop (adder U1 and filter U2) and the addition of a digital control circuit such as the one shown, which contains digital signals OT and TT, and a digital selection switch S1.

Circuit 400 has an additional incidental benefit of reducing the metastability of quantizer U3 because its decision time, the leading edge of a pulse of SampleClk in FIG. 5, occurs in a period in which both signals OT and TT are low. Thus, quantizer U3 need only be out of metastability before the rising edge of signal TT, and there will be no impact on the linearity of the circuit.

However, while this approach using multi-bit feedback symbols has the benefit of preventing ISI, as above its range of operation (with a three bit feedback symbol) will be restricted to values from ⅓ to ⅔ of the input signal. A preferable solution allows for use of the multi-bit feedback symbol without limiting the range of the input signal.

Figure 6:
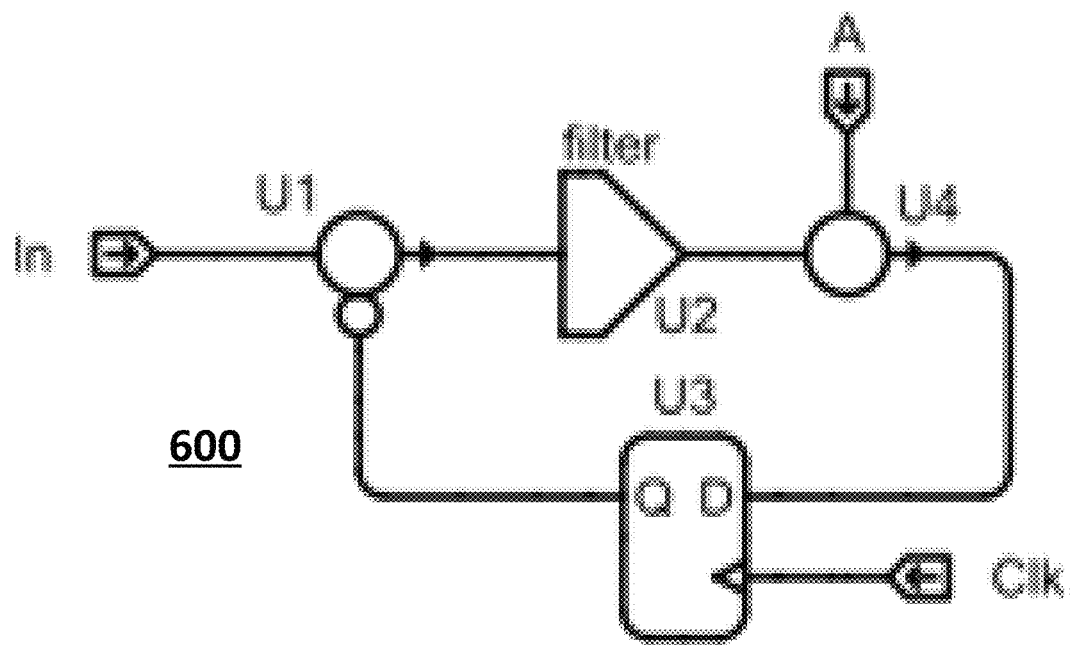
FIG. 6 is a circuit diagram of an improved single-bit sigma-delta modulator according to still another embodiment.

FIG. 6 is a diagram of a circuit 600 that allows operation of a ΣΔ modulator with a three-bit feedback symbol to be combined with normal full range operation. This solution may be thought of as an "analog" solution because it does not change the digital components of the loop, and adds an analog signal.

In circuit 600, circuit 200 of FIG. 2 has been modified by placing adder U4 between filter U2 and quantizer U3. Adder U4 receives an analog signal A along with the error signal from filter U2, and outputs a signal that is input to quantizer U3. The analog signal A thus modifies the input to quantizer U3, and thus potentially changes the output of quantizer U3.

The analog signal A is selected so that the loop will generate the multi-bit feedback symbols (−1, −1, 1) and (−1, 1, 1) until the error in the loop exceeds a certain threshold, at which point the loop will not necessarily select the multi-bit feedback symbols, but rather will, when the input signal is too large for the multi-bit feedback symbols to reduce the error, change the multi-bit feedback symbols to (−1, −1, −1) and (1, 1, 1) so that it appears as if the loop is choosing between values of 1 and −1 as in the prior art.

Figure 7:
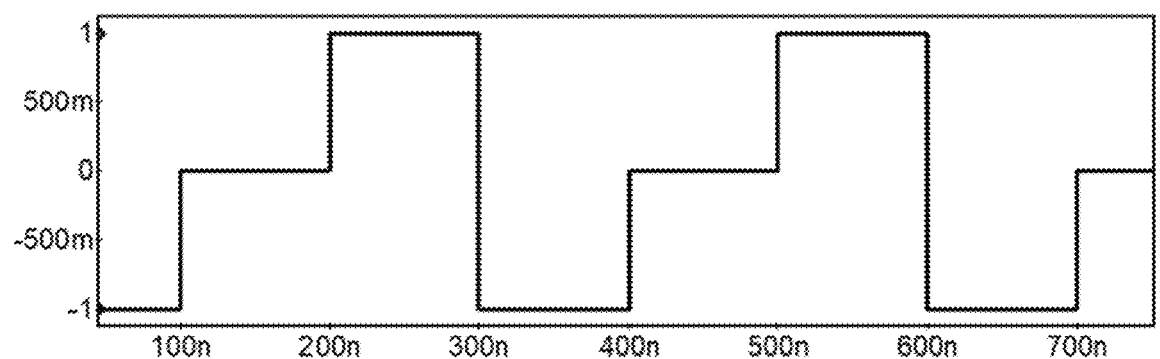
FIG. 7 is a graph of an analog signal that may be used with the circuit of FIG. 6 in one embodiment.

FIG. 7 illustrates the analog signal A inserted in the loop by adding it to the error signal with adder U4 in one embodiment. Analog signal A executes a pattern of three levels. For the duration of one clock cycle analog signal A is low, then for the next clock cycle it is nominally zero, and for the third clock cycle A is high.

Analog signal A is added to the error signal from filter U2 by adder U4. When the error signal is small quantizer U3 will receive as its input a low level in the first clock cycle due to the added analog signal A being low, and thus will feedback a 0.

In the second clock cycle quantizer U3 will see only the error signal from filter U2, as analog signal A is 0 during this time, and quantizer U3 will thus feedback a 0 or a 1 dependent only upon that error signal. In the third cycle quantizer U3 will see a high level due to the added analog signal A being high, and will thus feed back a 1.

Thus the addition of analog signal A to the error signal from filter U2 results in a sequence of either (−1, −1, 1) if the error signal is low in the middle of the three clock cycles, and (−1, 1, 1) if the error signal is high in the middle cycle. The analog circuit 600 thus effectively chooses either (−1, −1, 1) or (−1, 1, 1), a result similar to that of the digital circuits 300 and 400 of FIGS. 3 and 4.

It should be noted that in extreme cases, the analog circuit 600 of FIG. 6 is able to cause the first bit of the three-bit feedback symbol to be 1 rather than −1 if the error signal is sufficiently high, and to cause the last bit to be −1 rather than 1 if the error signal is sufficiently low. The digital circuits 300 and 400 of FIGS. 3 and 4 are not able to change these bits.

Another difference between the analog circuit 600 and digital circuits 300 and 400 is that in the digital circuits the clock signal supplied to quantizer U3 occurs once for every three steps of the OT and TT signals. As will be appreciated by one of skill in the art, rate of quantization is an important factor in the $\Sigma\Delta$ loop performance; i.e., the higher the rate of sampling, the lower the noise. While the digital implementation of circuits 300 and 400 has much reduced ISI at the expense of the input range, it has also caused the sampling clock to be ⅓ of the rate of the state change of the OT and TT signals. By contrast, analog circuit 600 has not caused a clock rate reduction; a sample is taken on every clock edge, and the analog signal advances through its sequence of values of −1, 0, and 1 at the same clock rate. There is thus no reduction in the full range of the analog circuit 600 as occurs in the digital circuits 300 and 400.

Figure 8:
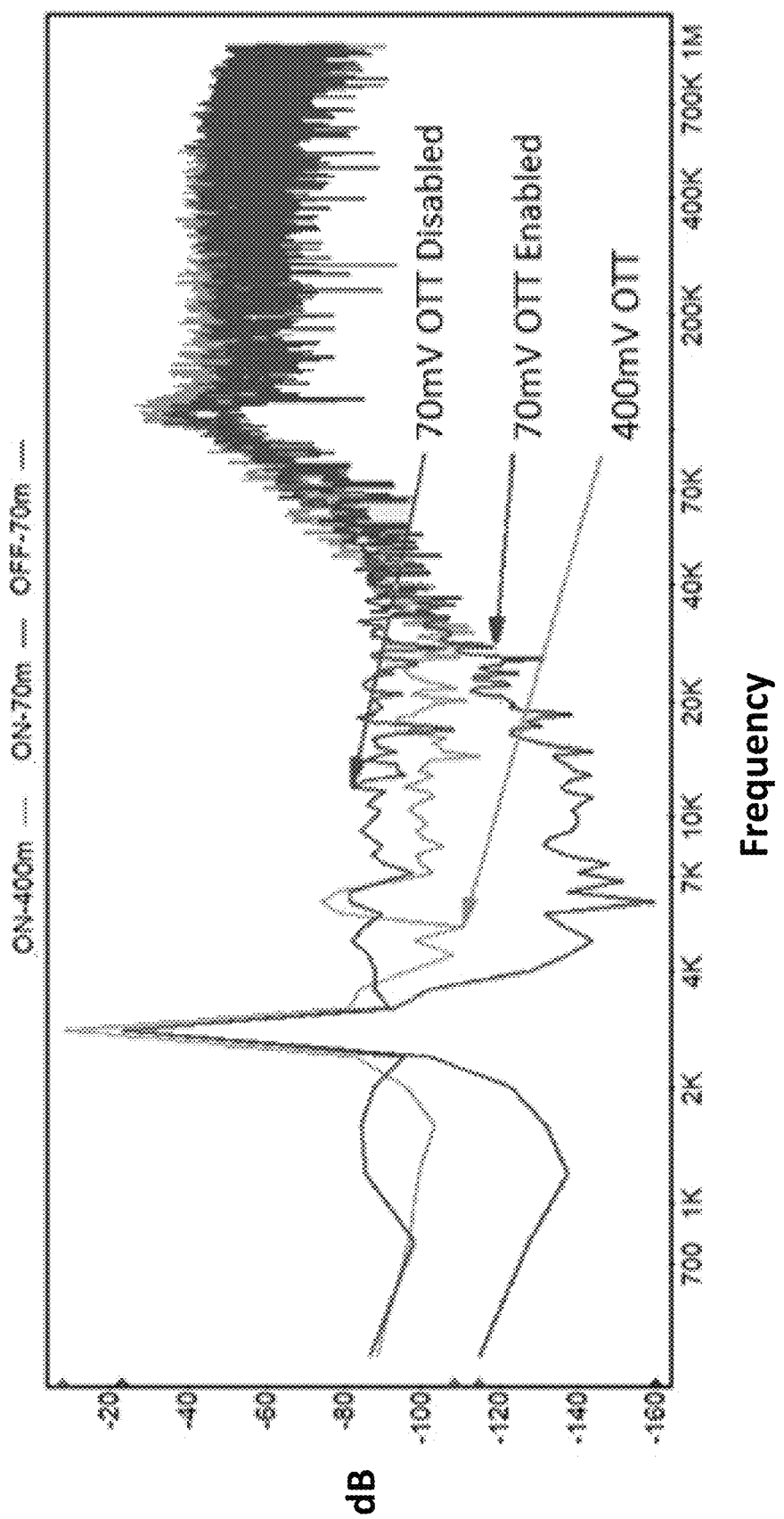
FIG. 8 is a graph of the noise performance of several embodiments of a single-bit sigma-delta modulator.

FIG. 8 illustrates graphs of the noise behavior of a $\Sigma\Delta$ modulator designed using the technique described above, including the use of the added analog signal, compared to a conventional $\Sigma\Delta$ modulator. The various plot lines show simulations of the noise of the present approach where the loop filter U2 in FIG. 6 is a fifth order filter.

As above, using a three-bit feedback symbol without the added analog signal reduces the range of a $\Sigma\Delta$ modulator to a range between ⅓ and ⅔ of its nominal range; even with an added analog signal allowing use of the full nominal range, the reduction in ISI is only expected to be effective in that reduced portion of the nominal range. If the nominal range of a sigma-delta modulator is from −1 volt to 1 volt, with a three-bit feedback symbol that reduced portion of the range is thus from −333 millivolts (mV) to 333 mV.

The graph in FIG. 8 labeled "70 mV OTT Enabled" shows the noise performance of a $\Sigma\Delta$ modulator of the present approach running with an input signal having an amplitude of 70 mV (which is within the reduced portion of the range from −333 mV to 333 mV) using the technique of the added analog signal described above with respect to FIGS. 6 and 7. The graph shown as "70 mV OTT Disabled" is the noise performance of a $\Sigma\Delta$ modulator with an input signal of the same amplitude without the benefit of the described technique. The 70 mV input is within the range in which only the multi-bit feedback symbols are used.

From FIG. 8 it can be seen that, for example, using the technique described herein the noise level at a frequency of 10 kilohertz (khz) is about −140 decibels (dB). Without the present technique, i.e., without either the multi-bit feedback symbols or the added analog signal, in the conventional circuit the noise level at the same 10 khz frequency is significantly worse due to the presence of ISI, only about −85 dB.

The graph in FIG. 8 shown as "400 mV OTT" shows the noise performance of a $\Sigma\Delta$ modulator running with an input signal having an amplitude of 400 mV, again using the present approach of the added analog signal. Now the 400 mV signal is outside the reduced portion of the nominal range, and is so large as to cause the selection of the multi-bit feedback symbols (−1, −1, 1) or (−1, 1, 1) to not be possible, so that the $\Sigma\Delta$ modulator has switched to feedback symbols of (−1, −1, −1) and (1, 1, 1) and appears to be operating in the known mode using single bits of 0 and 1 for some cycles.

Due to the larger signal being outside the reduced portion of the nominal range of use of the multi-bit feedback symbols, the reduction in ISI would not be expected to occur. Further, the noise associated with a greater amplitude signal would be expected to be greater than that associated with the smaller 70 mV signal if neither $\Sigma\Delta$ modulator uses multi-bit feedback symbols.

Figure 9:
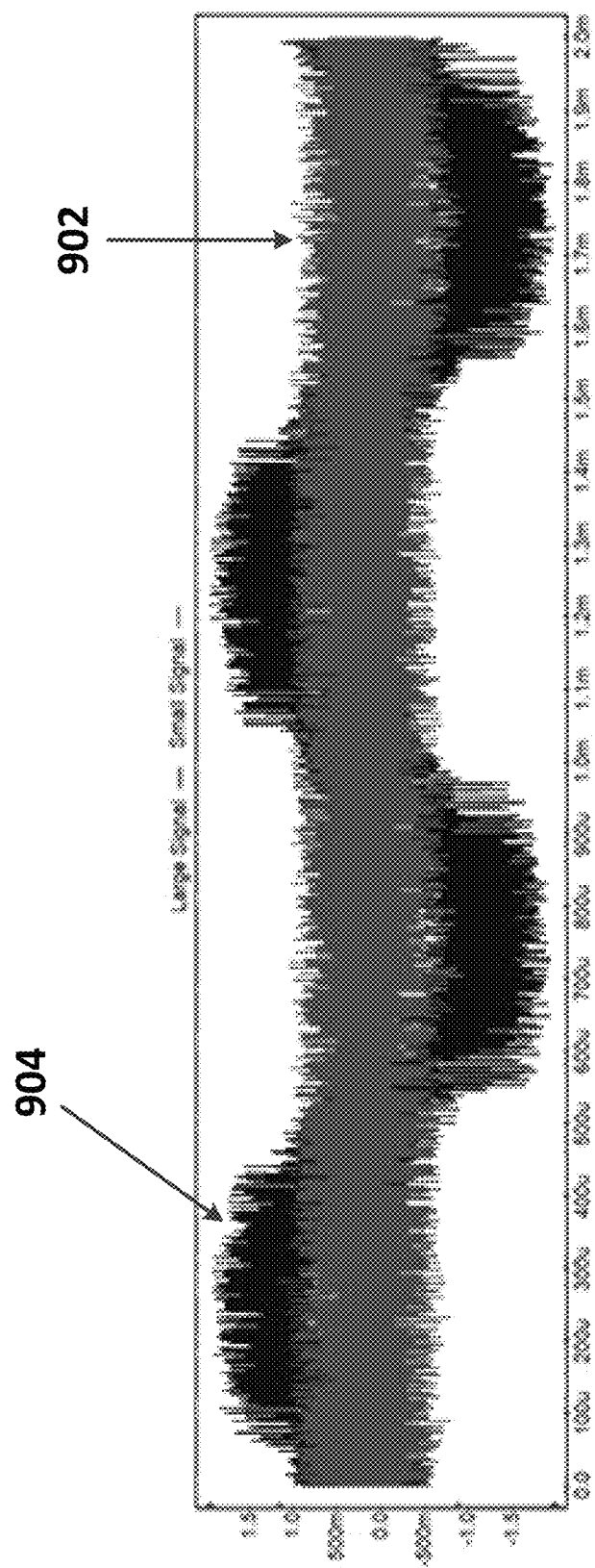
FIG. 9 illustrates graphs of the error signal in one embodiment of a single-bit sigma-delta modulator.

Nonetheless, in according with the present approach, as seen in FIG. 9 a $\Sigma\Delta$ modulator using a 400 mV signal with the added analog signal technique described herein (which again is not expected to operate on such a large signal) still out-performs a conventional $\Sigma\Delta$ modulator using the smaller 70 mV signal at many frequencies; it is able to do so because the signal is an AC signal that for some part of the waveform is low enough to utilize the multi-bit feedback symbols and reduce ISI for that part of the signal.

FIG. 9 illustrates graphs of the error signal in one embodiment of a $\Sigma\Delta$ modulator of the present approach showing how the error signal can overwhelm added analog signal and change the multi-bit pattern as described above. Curve 902 in FIG. 9 shows an error signal bounded in the region of 1 to −1, i.e., within the range that the multi-bit feedback symbols can handle; as long as this is the case, the $\Sigma\Delta$ modulator will produce the multi-bit feedback symbols as described above. In the three bit example herein, that means the first bit will always be low and the third bit will always be high, with the second bit changing depending upon the error signal.

Curve 904 of FIG. 9 shows the error signal growing beyond the 1 to −1 range. Now the first bit may be high instead of low, and the last bit may be low instead of high, so that the feedback looks like the conventional 1 and −1 feedback symbols of the prior art.

By using the described technique of multi-bit feedback symbols and an added analog signal, it is possible to construct a $\Sigma\Delta$ modulator that reduces the noise due to ISI without limiting the range of the $\Sigma\Delta$ modulator.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art, including the number of bits to be used in a multi-bit feedback symbol, an appropriate clock frequency, whether the reduced range of a digital solution as shown in FIGS. 3 and 4 is acceptable, etc. Further, the illustration of components is exemplary; one of skill in the art will be able to select the appropriate number and type of adders, filters, quantizers and related elements that is appropriate for a particular application.

These and other variations upon the embodiments are intended to be covered by the present disclosure, which is limited only by the appended claims.

What is claimed is:

1. An apparatus, comprising:
a first adder configured to receive an input signal and a feedback signal and to output a sum of the input signal and the feedback signal as an error signal;
a filter coupled to the first adder and configured to receive as an input the error signal, generate a filtered error signal, and output the filtered error signal;
a quantizer coupled to the filter and configured to receive as an input the filtered error signal and to generate a plurality of quantizer outputs upon receipt of a series of clock signals, each one of the plurality of quantizer outputs being high or low depending upon the filtered error signal;
a control circuit configured to generate a plurality of control signals, each one of the plurality of control signals selecting a different one of a plurality of multi-bit feedback signals comprising a plurality of quantizer outputs; and
a switch coupled to the control circuit, the quantizer, and the first adder, the switch having a first position in which a first one of the plurality of control signals selects a first one of the multi-bit feedback symbols to be fed back to the first adder and a second position in which a second one of the plurality of control signals selects a second one of the multi-bit feedback symbols to be fed back to the first adder;
whereby the first adder receives as the feedback signal either the first one of the plurality of multi-bit feedback symbols or the second one of the plurality of multi-bit feedback symbols to be added to the input signal.

2. The apparatus of claim 1 wherein the plurality of control signals is two control signals.

3. The apparatus of claim 1 wherein the plurality of quantizer outputs in each multi-bit feedback symbol is a sequence of three quantizer outputs.

4. The apparatus of claim 3 wherein the first one of the multi-bit feedback symbols is a sequence of low, low, and high quantizer outputs, and the second one of the multi-bit feedback symbols is a sequence of low, high, and high quantizer outputs.

5. The apparatus of claim 4 wherein feedback of the first and second ones of the multi-bit feedback symbols causes the apparatus to operate in a range of input signals that is a center one-third of a nominal range of an apparatus with feedback of single-bit feedback symbols.

6. An apparatus, comprising:
a first adder configured to receive an input signal and a feedback signal and to output a sum of the input signal and the feedback signal as an error signal;
a filter coupled to the first adder and configured to receive as an input the error signal, generate a filtered error signal, and output the filtered error signal;
a second adder coupled to the filter and configured to receive as inputs the filtered error signal and an analog signal and to output a sum of the filtered signal and the analog signal as a modified error signal, the analog signal comprising a repeating series of voltage levels; and
a quantizer coupled to the filter and configured to receive as an input the modified error signal and to generate as the feedback signal a plurality of quantizer outputs upon receipt of a series of clock signals, each quantizer output being generated upon receipt of a clock signal and being high or low depending upon the modified error signal.

7. The apparatus of claim 6 wherein the analog signal changes between a plurality of voltage levels in a period of time between two consecutive clock signals, one of the voltage levels of a low magnitude sufficient to drive the quantizer to generate a low output and one of the voltage levels of a high magnitude sufficient to drive the quantizer to generate a high output.

8. The apparatus of claim 7 wherein:
the plurality of voltages in the analog signal is three different voltages, and the analog signal changes from the low magnitude to a zero magnitude to the high magnitude in equal portions of the period of time between two consecutive clock signals; and,
whereby the first adder receives as the feedback signal either a first sequence of a plurality of quantizer outputs that is low, low, high, or a second sequence of a plurality of quantizer outputs that is low, high, high.

9. The apparatus of claim 8 wherein an amplitude of the input signal is within a range that is a center one-third of a nominal range of an apparatus with feedback of single-bit feedback symbols.

10. The apparatus of claim 9 wherein the amplitude of the analog signal is outside the range that is a center one-third of a nominal range of an apparatus with feedback of single-bit feedback symbols, and the first adder receives as the feedback signal either a first sequence of a plurality of quantizer outputs that is low, low, and low, or a second sequence of a plurality of quantizer outputs that is high, high, and high.

* * * * *